United States Patent [19]
Flynn et al.

[11] Patent Number: 5,642,487
[45] Date of Patent: Jun. 24, 1997

[54] INTEGRATED CIRCUIT AND METHOD OF OPERATION

[75] Inventors: David Walter Flynn, Cambridge; Philip Brian Endecott, Poole, both of United Kingdom

[73] Assignee: Advanced Risc Machines Limited, Cambridge, United Kingdom

[21] Appl. No.: 292,481

[22] Filed: Aug. 18, 1994

[30] Foreign Application Priority Data

Aug. 23, 1993 [GB] United Kingdom ............ 9317506

[51] Int. Cl.⁶ .................................................. G06F 13/00
[52] U.S. Cl. ................... 395/250; 395/552; 395/494
[58] Field of Search ........................... 395/494, 550, 395/250, 552, 556

[56] References Cited

U.S. PATENT DOCUMENTS

| | | | |
|---|---|---|---|
| 3,969,703 | 7/1976 | Kwiatkowski et al. | 395/494 |
| 3,984,812 | 10/1976 | Dahlberg et al. | 395/494 |
| 4,424,462 | 1/1984 | Gay | 307/603 |
| 4,631,659 | 12/1986 | Hayn, II et al. | 395/494 |
| 4,800,304 | 1/1989 | Takenchi | 307/602 |
| 4,849,702 | 7/1989 | West et al. | 328/63 |
| 4,868,522 | 9/1989 | Popat et al. | 331/2 |
| 5,151,986 | 9/1992 | Langan et al. | 395/550 |
| 5,210,858 | 5/1993 | Jensen et al. | 395/494 |
| 5,239,639 | 8/1993 | Fischer et al. | 395/550 |
| 5,247,636 | 9/1993 | Minnick et al. | 395/550 |
| 5,265,243 | 11/1993 | Povenmire et al. | 395/550 |
| 5,301,306 | 4/1994 | Plog | 395/550 |
| 5,301,307 | 4/1994 | Murooka et al. | 395/550 |
| 5,317,202 | 5/1994 | Waizman | 307/269 |
| 5,416,918 | 5/1995 | Gleason et al. | 395/550 |
| 5,418,933 | 5/1995 | Kimura et al. | 395/550 |
| 5,479,646 | 12/1995 | Proebsting | 395/494 |
| 5,481,690 | 1/1996 | Grumlose et al. | 395/494 |

FOREIGN PATENT DOCUMENTS

| | | |
|---|---|---|
| 0 362 691 A2 | 4/1990 | European Pat. Off. . |
| 0 544 164 A1 | 6/1993 | European Pat. Off. . |
| 2236415 | 4/1991 | United Kingdom . |

*Primary Examiner*—Ayaz R. Sheikh
*Attorney, Agent, or Firm*—Albert C. Smith

[57] ABSTRACT

An integrated circuit includes a plurality of data handling devices and a data buffer for enabling transfer of data between the internal data handling devices and one or more external data handling devices external to the integrated circuit. A controller responds to an original clock signal for supplying a clock signal to control data transfer between the data handling devices. The controller includes a delay circuit operable to delay the original clock signal to generate a delayed clock signal, and includes a selector for inhibiting operation of the delay circuit and for selecting the original clock signal for controlling data transfer from an internal data handling device to another data handling device. The selector also enables operation of the delay circuit and selects the delayed clock signal for controlling data transfer from an external data handling device to an internal data handling device.

13 Claims, 8 Drawing Sheets

INTEGRATED CIRCUIT AND METHOD OF OPERATION

BACKGROUND OF THE INVENTION

1. Field of the Invention

This invention relates to integrated circuits.

2. Description of the Prior Art

Some data processing integrated circuits comprise a number of data handling devices such as a microprocessor, random access memory (RAM), data buffers or other peripheral logic functions, fabricated as a single semiconductor chip. These on-chip data handling devices (referred to 'internal' data handling devices) are interconnected to allow data communication between the devices, for example by means of a common data bus.

During data communication between internal data handling devices, the communicating devices can be controlled by a clocking pulses of a common clock signal. The communicating devices can operate synchronously in this way because the physical proximity of the devices means that any propagation delays for data transfer between the devices are negligible.

The clocking of data communication between an internal data handling device and an external (off-chip) data handling device, such as an external RAM device, is not so straightforward. Generally, data buffering is required in order to interface between internal and external devices. In particular, data transferred from an internal device to an external device is buffered by an output data buffer, and data transferred from an external device to an internal device is buffered by an input data buffer. Both of these data buffers introduce propagation delays, which can depend on a number of factors such as the basic operation speed of the integrated circuit, temperature, operating voltage and the capacitative loading of the data buffers.

The propagation delays introduced by the data buffers mean that data signals generated by an internal data handling device are received by an external device slightly late, with respect to the clocking of the internal devices, and data signals returned by the external device are received later still by the internal devices. This means that data signal returned by an external device are not synchronised with the clocking of the internal devices.

One previously proposed solution to this problem is to employ so-called wait states, whereby on-chip processing is suspended for one or more clock cycles to allow data signals received from external data handling devices to be re-synchronised with the clocking of the internal devices. However, the use of wait states slows down the overall operation of the integrated circuit, especially in applications requiring frequent accessing of external data handling devices.

A further requirement imposed on many integrated circuits is that of a low power consumption. This is particularly the case for integrated circuits intended for use in battery-powered portable equipment. This requirement means that another possible solution to the above problems, namely the use of faster data buffers and external devices, is undesirable, since the power consumption of such devices increases with their processing speed.

SUMMARY OF THE INVENTION

It is an object of the present invention to reduce the power consumption of an integrated circuit while still allowing synchronised communications between on-chip and off-chip data handling devices.

This invention proves an integrated circuit comprising:

a plurality of internal data handling devices;

a data buffer, the data buffer enabling transfer of data between the internal data handling devices and one or more external data handling devices external to the integrated circuit; and control means, responsive to an original clock signal, for supplying a clock signal to control data transfer between the data handling devices, the control means comprising a delay circuit operable to delay the original clock signal to generate a delayed clock signal, and selection means operable:

(i) to inhibit operation of the delay circuit and to select the original clock signal for controlling data transfer from an internal data handling device to another data handling device; and (ii) to enable operation of the delay circuit and to select the delayed clock signal for controlling data transfer from an external data handling device to an internal data handling device.

The invention addresses the two problems outlines above, namely the synchronising of data received from an external data handling device with the clocking of internal devices and the requirement of low power consumption, by employing a control means which generates a delayed clock signal only when that signal is required. In other words, the delayed clock signal is generated when data re transferred from an external device to an internal device, but the operation of the delay circuit is inhibited at other times. This means that unnecessary power consumption in operating the delay circuit is avoided.

In order to avoid spurious data processing operations occurring because of irregular clocking pulses being supplied when switching between the original clock signal and the delayed clock signal, it is preferred that the selection means comprises means for controlling a time of switching between the original clock signal and the delayed clock signal such that clocking pulses supplied to the internal data handling devices have at least a predetermined minimum pulse width.

In some circumstances, it may be desirable to prevent switching between the original clock signal and the delayed clock signal—for example, curing a rapid series of short data transfers from external devices. In this case, it is preferred that at least one of the internal data handling devices comprises programmable logic means for overriding operation of the selection means, to enable operation of the delay circuit and to select the delayed clock signal during data transfer from an internal data handling device to another data handling device.

Although the original clock signal may be supplied from an external (off-chip) clock generator via an appropriate input buffer, it is preferred that the integrated circuit comprises means for generating the original clock signal.

Preferably the data buffer comprises: an output data buffer operable to transfer data from an internal data handling device to an external data handling device, the output data buffer delaying transferred data by an output delay period; and an input data buffer operable to transfer data to an internal data handling device from an external data handling device, the input data buffer delaying transferred data by an input delay period.

In a preferred embodiment the delay circuit comprises: a first delay device for delaying the original clock signal by the output delay period to generate an intermediate clock signal; and a second delay device connected to receive the intermediate clock signal and operable to delay the intermediate clock signal by the input delay period to generate the delayed clock signal. The intermediate clock signal is thus synchronised with data output by the integrated circuit, and can be employed, for example, as a clock signal to control operation of an external device.

In an advantageously simple embodiment, the first delay device comprises an output clock buffer connected between the clock generator and an output terminal of the integrated circuit. Also, it is preferred that the second delay device comprises an input clock buffer connected to the output terminal of the integrated circuit. The use of input and output buffers, connected to an output terminal of the integrated circuit means that any temperature or other dependence of the delay periods of the input and output data buffers are automatically compensated by corresponding variations of the delays imposed by the input and output clock buffers.

It is preferred that the integrated circuit comprises means for supplying the intermediate clock signal to one or more of the external data handling devices. In this way, those external data handling devices which require a clock signal can be controlled by the intermediate clock signal, which is made synchronous with data transferred from an internal device to the external device.

In order that the data input and output of the integrated circuit can be characterised with respect to external clock signals, it is preferred that the integrated circuit comprises logic means for temporarily isolating the intermediate clock signal from the second delay device; and in which the second logic device comprises means for receiving a test clock signal when the intermediate clock signal is isolated from the second logic device. This allows an external test clock signal to be introduced in place of the intermediate clock signal.

Preferably one of the internal data handling devices is a microprocessor.

Viewed from a second aspect this invention provides apparatus for testing an integrated circuit as defined above, the apparatus comprising:

means for generating a test clock signal;

means for controlling the logic means to temporarily isolate the intermediate clock signal from the second delay;

means for supplying the test clock signal to the second delay device;

means for initiating test data transfers to and from one or more internal data handling devices; and means for detecting a propagation delay between clock pulses of the test clock signal and data signals output by the integrated circuit.

Viewed from a third aspect this invention provides a data processing apparatus comprising: an integrated circuit as defined above; and one or more external data handling devices connected to the integrated circuit.

Viewed from a fourth aspect this invention provides a method of operating an integrated circuit comprising a plurality of internal data handling devices, a data buffer, the data buffer enabling transfer of data between the internal data handling devices and one or more external data handling devices external to the integrated circuit, and control means, responsive to an original clock signal, for supplying a clock signal to control data transfer between the data handling devices, the control means comprising a delay circuit operable to delay the original clock signal to generate a delayed clock signal; the method comprising the steps of:

(i) inhibiting operation of the delay circuit and selecting the original clock signal for controlling data transfer from an internal data handling device to another data handling device; and (ii) enabling operation of the delay circuit and selecting the delayed clock signal for controlling data transfer from an external data handling device to an internal data handling device.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
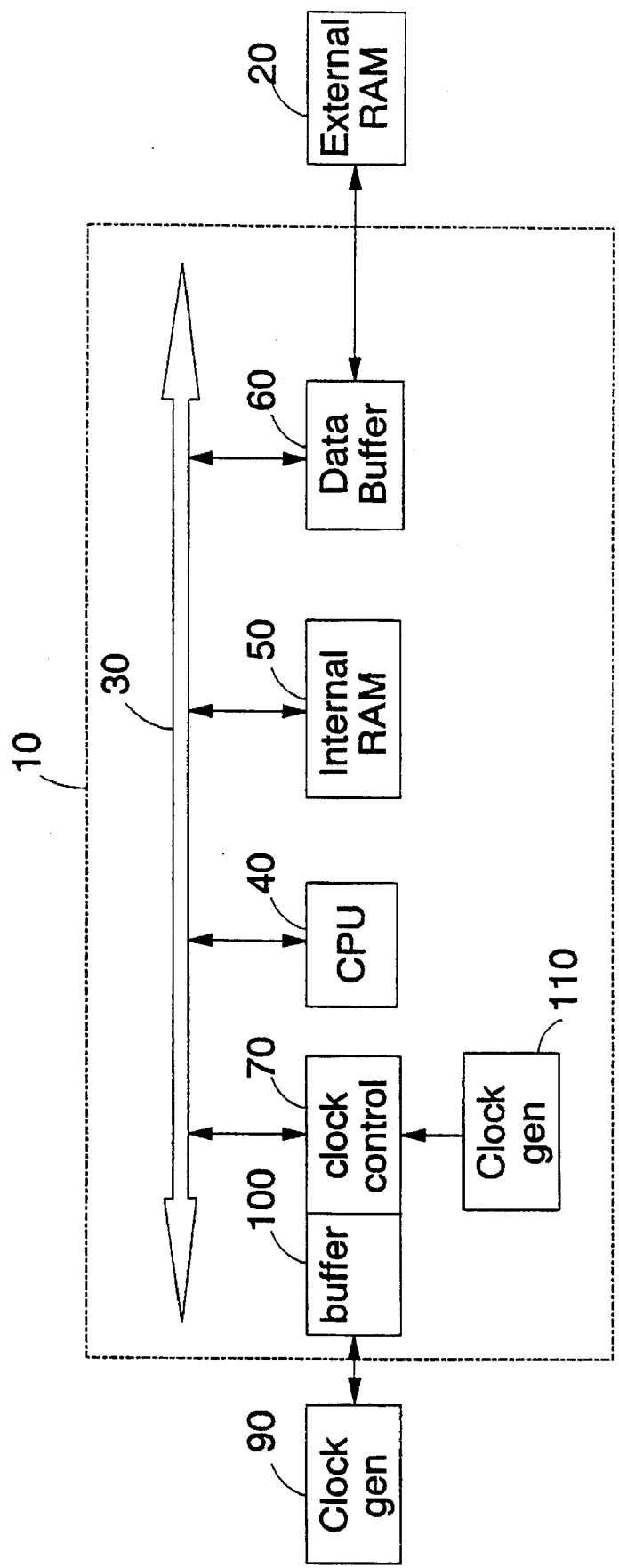
FIG. 1 is a schematic block diagram of an integrated circuit connected to an external random access memory.

FIG. 1 is a schematic block diagram of an integrated circuit 10 connected to an external random access memory (RAM) 20. The integrated circuit 10 is a modular structure comprising a number of data handling devices connected to a common data bus 30. In the embodiment illustrated in FIG. 1, the data handling devices (referred to as 'internal' data handling devices since they are fabricated as part of the integrated circuit) comprise a microprocessor unit (CPU) 40 and an internal RAM 50.

A data buffer 60 allows communication between devices connected to the data bus 30 and the external RAM 20. An output side of the data buffer 60 buffers data transferred from an internal data handling device to the external RAM 20, and an input side of the data buffer 60 buffers data received from the external RAM 20.

A clock controller 70 controls the supply of clock signals to the CPU 40 and the internal RAM 50. In order to achieve this, the clock controller 70 receives a master clock signal (referred to as the 'early' clock signal) from which other clock signals are derived by the clock controller 70. The early clock signal is supplied to the clock controller 70 from either an external clock generator 90 (via a buffer 100) or from an internal (on-chip) clock generator 110. The clock controller will be described in detail below.

Figure 2:
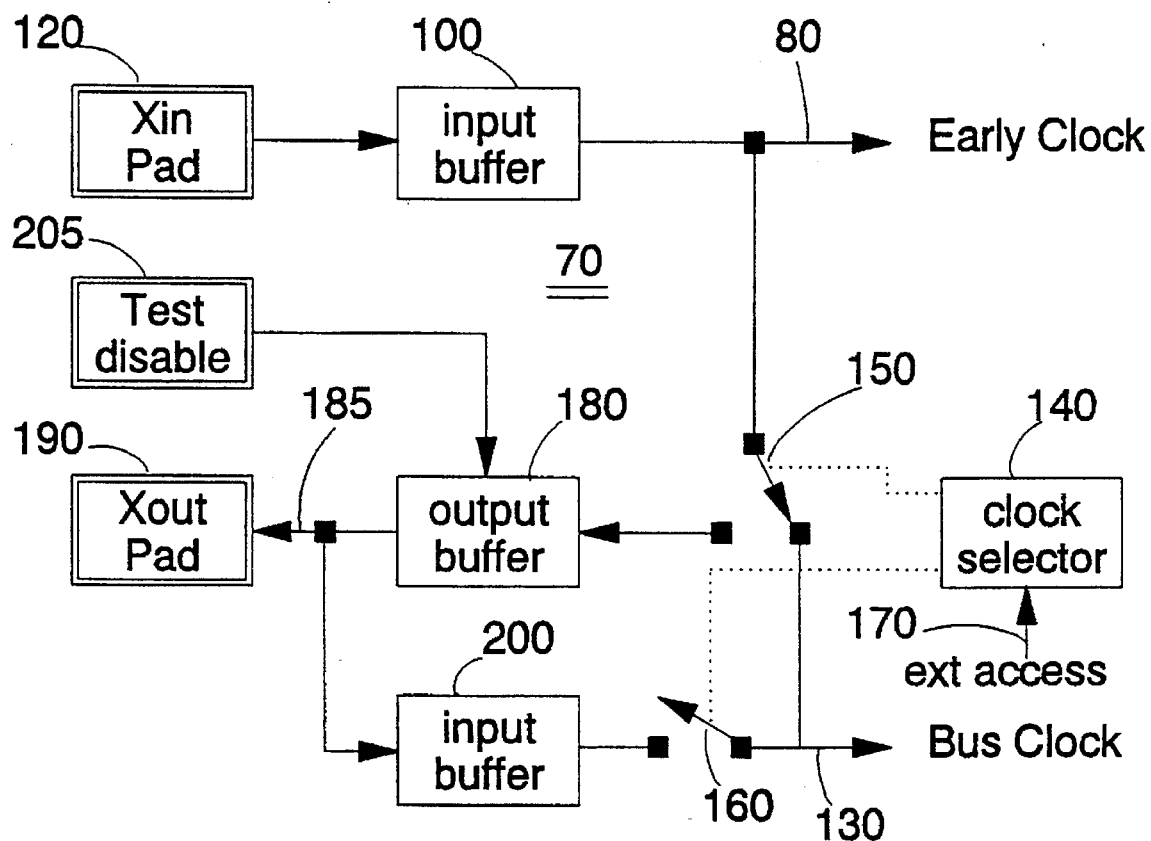
FIG. 2 is a schematic block diagram of a clock controller.

FIG. 2 is a schematic block diagram of the clock controller 70. In the version shown in FIG. 2, the clock controller 70 is arranged to receive a clock signal generated by an external clock generator 90 via an input terminal or pad 120. The externally generated clock signal is buffered by the input buffer 100 and then forms the early clock signal 80.

Internal (on-chip) data handling devices are controlled by a bus clock signal 130. A clock selector 140 controls two multiplexers or switches 150, 160 to control the generation of the bus clock signal 130, as described below.

The clock selector 140 detects when data are being accessed from outside the integrated circuit 10, i.e. from an external data handling device such as the external RAM 20. This detection is made either by the clock selector 140 detecting the address of an external device being placed on the bus 30, or by means of a external access signal 170 supplied to the clock selector 140 by one of the internal data handling devices.

When the clock selector 140 detects that data are not currently being received from an external data handling device, the switch 150 is set to the position shown in FIG. 2 so that the early clock signal is supplied to the internal data handling devices as the bus clock signal 130. In this case, the switch 160 is opened.

When the clock selector 140 detects that data are being accessed from an external data handling device, the clock selector 140 controls the switch 150 to move to its other position so that the early clock signal 80 is supplied to an output buffer 180. Also, the switch 160 is closed. The output buffer 180 acts as a first delay device which delays the early clock signal 80 by a delay period equal to that imposed by the output side of the data buffer 60. The early clock signal 80, having been delayed by the output buffer 180, is supplied to an output terminal or pad 190 of the integrated circuit. The pad 190 may be connected to an external pin of the integrated circuit, so that the clock signal delayed by the output buffer 180 (referred to as the 'external' clock signal) can be used to control one or more external data handling devices. Alternatively, the pad 190 may be left unconnected to an external pin; in this case, the connections to and from the pad 190 are simply used to provide a similar delay to the data paths between the data buffer 60 and the input/output terminals of the integrated circuit.

An input buffer 200 is connected to the pad 190 and serves as a second delay device to delay the clock signal further by a period equal to that imposed by the input side of the data buffer 60. The clock signal delayed by the input buffer 200 is then supplied, via the switch 160, to the internal data handling devices as the bus clock 130.

The clock selector also detects the relative timing of the early clock signal 80 and the delayed clock signal generated by the input buffer 200, and controls the switching time of the switches 150 and 160 such that a minimum clocking pulse width is maintained. This avoids the problem of spurious operation of the data handling devices in response to clocking pulses below the predetermined minimum width.

A test disable pad 205 supplies a signal to the output buffer 180 to disable operation of the output buffer 180 during test procedures. This feature will be described in more detail below.

As described above, the arrangement of FIG. 2 allows processing within the integrated circuit 10 to be performed using the early clock signal 80 as the bus clock signal 130 when data are not being read from an external data handling device. The output buffer 180 and the input buffer 200 are disconnected from the early clock signal 80 except when they are required to generate a delayed clock signal, for use as the bus clock signal during data transfer from an external data handling device. This means that power is not wasted by driving the output buffer 180 and the input buffer 200 unnecessarily.

Figure 3:
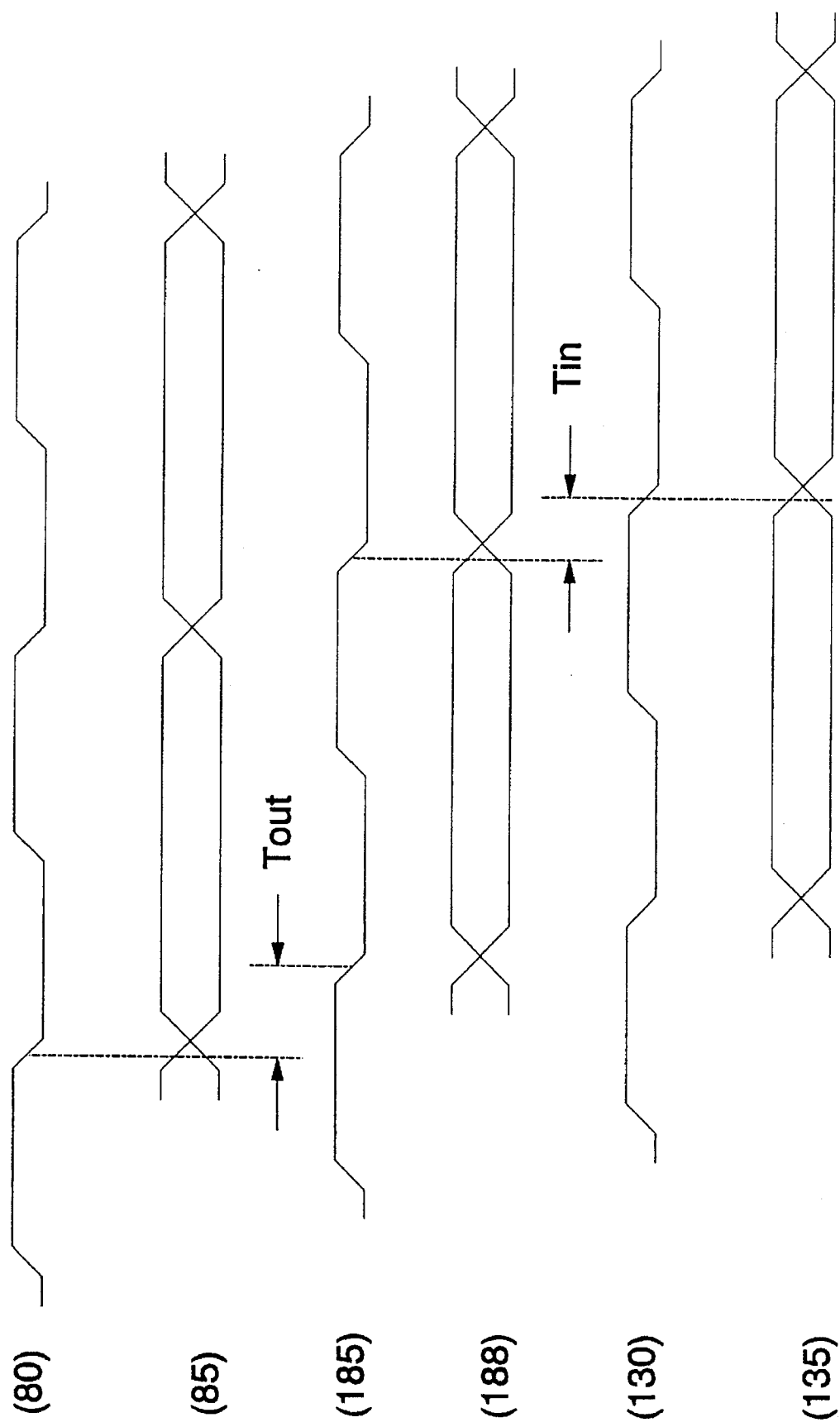
FIG. 3 is a schematic timing diagram illustrating the operation of the clock controller of FIG. 2.

FIG. 3 is a schematic timing diagram illustrating the operation of the clock controller of FIG. 2 during a data transfer from an external data handling device to an internal data handling device. FIG. 3 illustrates the early clock signal 80, the external clock signal 185 at the output of the output buffer 180, and the bus clock signal 130 generated at the output of the input buffer 200. FIG. 3 also illustrates internal data signals 85 synchronized to the early clock signal 80, external signals 188 generated by the external RAM 20 and synchronized with the external clock 185, and bus aligned signals 135 representing data received from the external RAM 20 and buffered by the input side of the data buffer 60. The bus aligned signals 135 are synchronized with the bus clock 130.

As shown in FIG. 3, the external clock 185 is delayed with respect to the early clock 80 by an output delay period Tout, and the bus clock 130 is delayed with respect to the external clock signal 185 by an input delay period Tin. The output delay period Tout is equal to the propagation delay of the output side of the data buffer 60, and the input delay period Tin is equal to the propagation delay of the input side of the data buffer 60.

Figure 4:
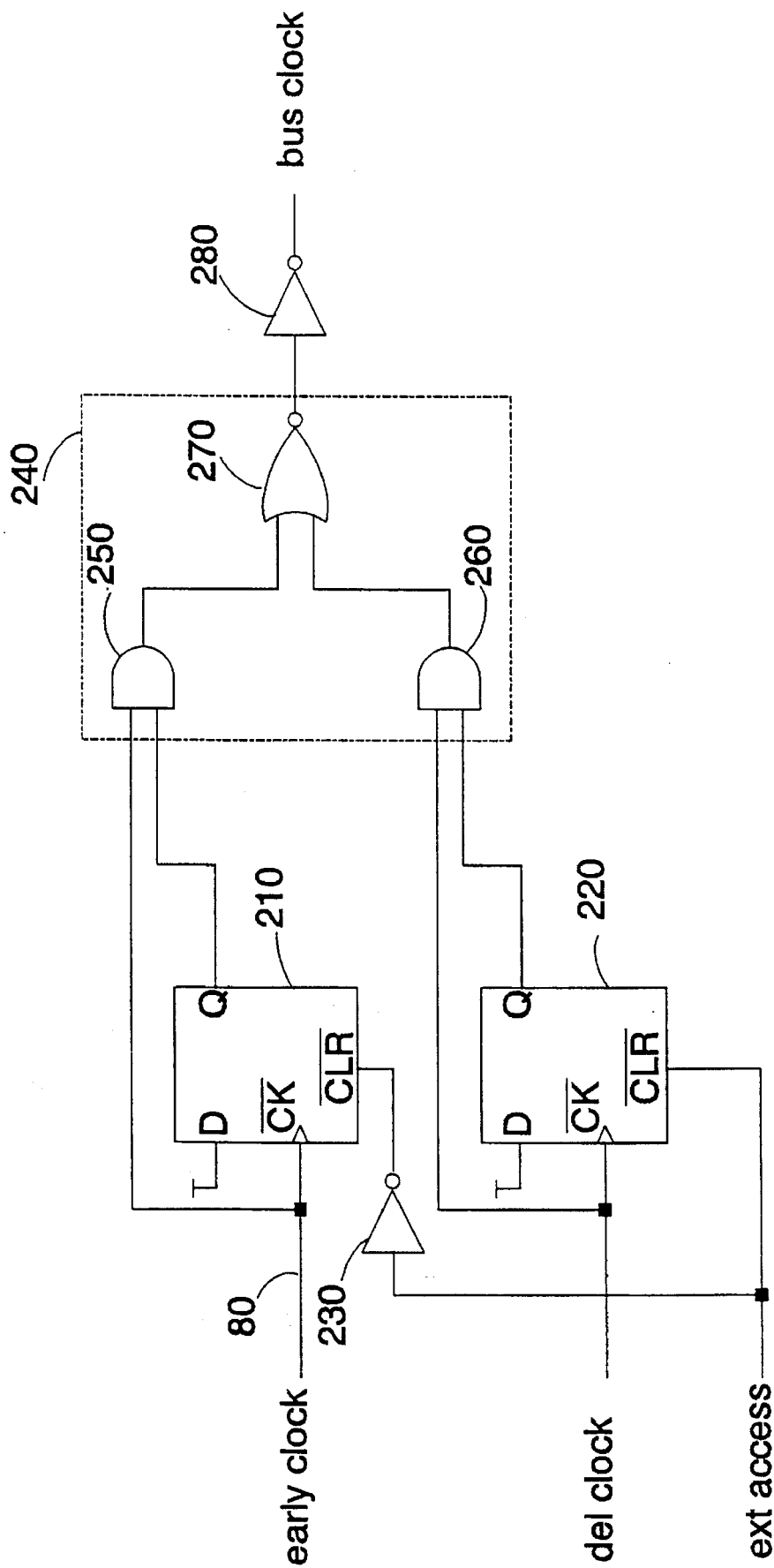
FIG. 4 is a schematic block diagram of a clock selector.

FIG. 4 is a schematic block diagram of one embodiment of the clock selector 140, which also embodies some of the function of the switches 150, 160.

In FIG. 4, the early clock signal 80 is supplied to the clocking input of a first D-type flip flop 210, and the delayed clock signal generated by the input buffer 200 is supplied to the clocking input of a second D-type flip flop 220. The 'D' inputs of the first and second D-type flip flops are held high.

The two D-type flip flops have asynchronous active low clear ($\overline{CLR}$) inputs and falling edge clock inputs. Thus a change of state of the $\overline{CLR}$ inputs has immediate effect. The $\overline{CLR}$ inputs of the two D-type flip flops are controlled by the external access control signal (via an inverter 230 in the case of the first D-type flip flop 210). This external access signal is synchronised with the currently selected bus clock signal, and indicates whether external data handling devices are to be accessed.

The 'Q' outputs of the first and second D-type flip flops are supplied, along with the respective early and delayed clock signals, as inputs to a multiplexer 240 of the 'and-or-invert' type. In particular, the Q output of the first D-type flip flop 210 is supplied with the early clock signal to an AND gate 250, and the Q output of the second D-type flip flop 220 is supplied with the delayed clock signal to an AND gate 260. The outputs of the two AND gates 250, 260 are combined by a NOR gate 270, the output of which is inverted by an inverter 280 to form the bus clock signal.

Figure 5:
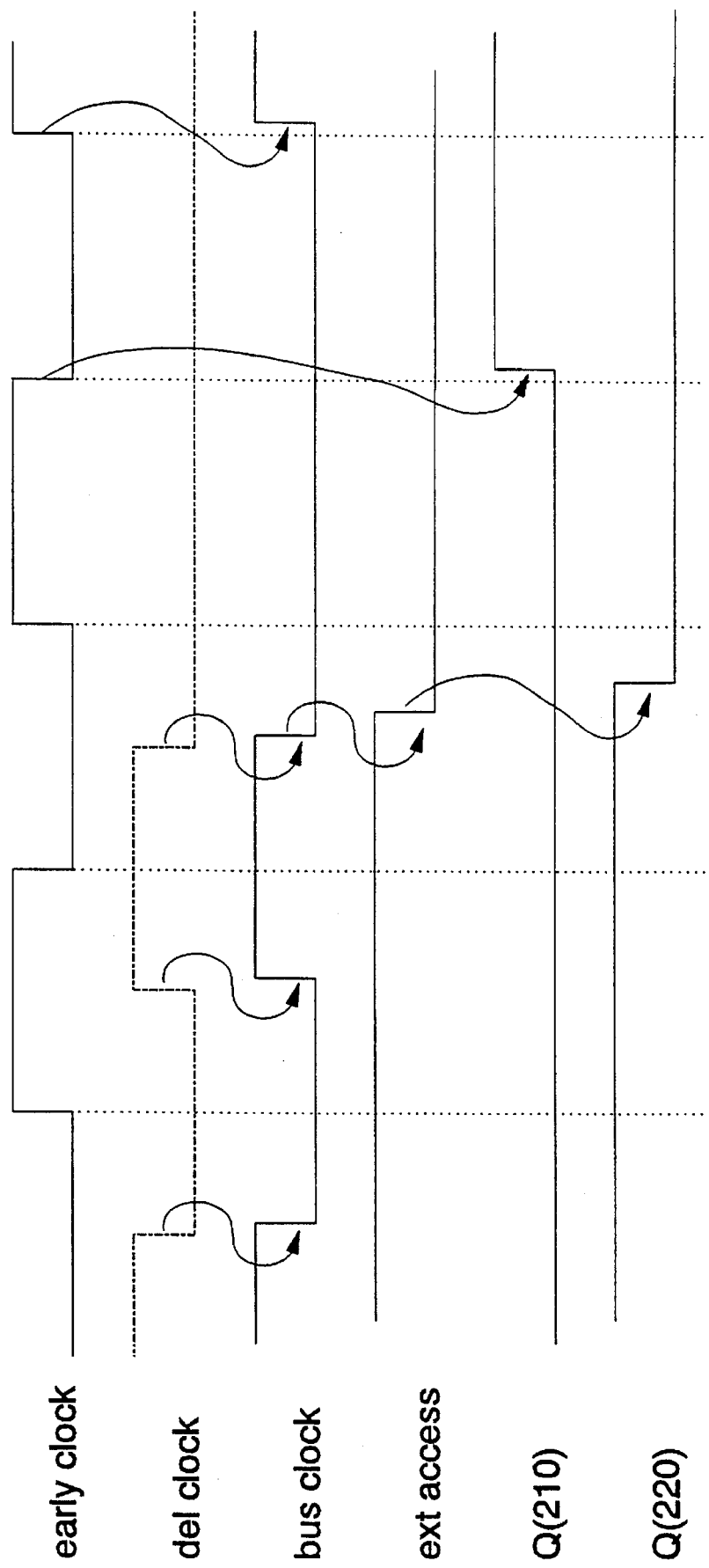
FIGS. 5 and 6 are schematic timing diagrams illustrating the operation of the clock selector of FIG. 4.

FIG. 5 is a schematic timing diagram illustrating the operation of the clock selector of FIG. 4 when switching from the delayed clock signal to the early clock signal. FIG. 5 illustrates the early clock signal, the delayed clock signal generated by the input buffer 200, the bus clock signal output by the inverter 280, the external access signal, the Q output of the first D-type flip flop 210, and the Q output of the second D-type flip flop 220. The external access signal indicates an external access when it is in a high state.

In FIG. 5, the external access signal changes from high to low to indicate the end of a current access of an external data handling device. This transition is made in synchronism with the falling edge of the current bus clock signal (the delayed clock signal). At this time the $\overline{CLR}$ input to the D-type flip flop 220 is selected, and the $\overline{CLR}$ input to the D-type flip flop 210 is deselected. This means that the Q output of the D-type flip flop 220 is set low, and the Q output of the D-type flip flop 210 is set high (equal to the D input of that flip flop) at the next falling edge of the early clock signal.

The bus clock signal output by the inverter 280 represents a logical AND combination of each of the early and delayed clock signals with the Q output of the respective flip flop. Since the Q output of the flip flop 220 is now set low, no further pulses of the delayed clock signal are passed by the multiplexer 240. In fact, the next clock pulse passed by the multiplexer 240 is a pulse of the early clock signal. The output buffer 180 and the input buffer 200 are switched off (or deselected by the switch 150) since the delayed clock signal is no longer required.

Figure 6:
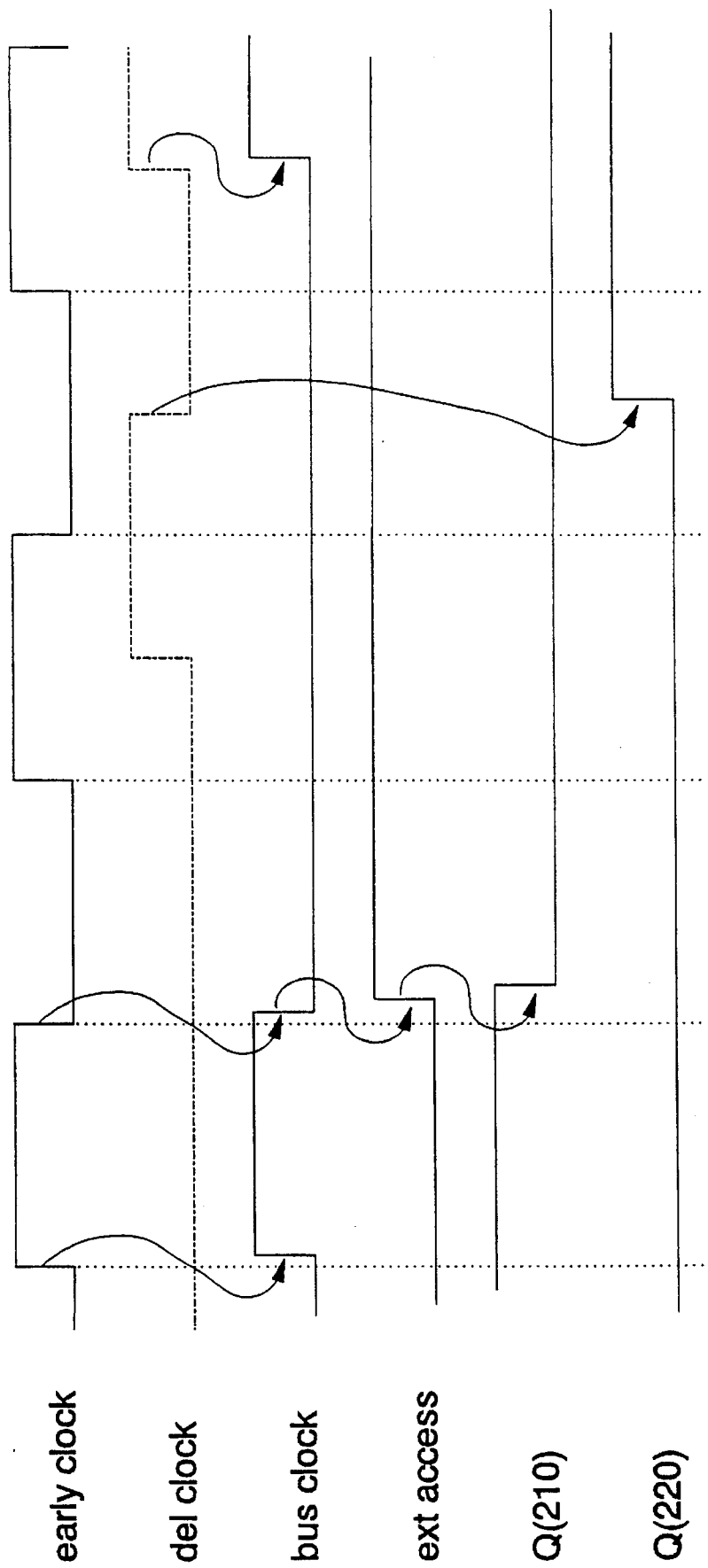

FIG. 6 is similar to FIG. 5, and illustrates a changeover from the early clock signal to the delayed clock signal. In this case, the external access signal serves to initiate the changeover and also to initiate generation of the delayed clock signal by the output buffer 180 and the input buffer 200, using the switch 150. As in the case of FIG. 5, a minimum pulse width is maintained at the time of switching from the early clock signal to the delayed clock signal.

Accordingly, the effect of the clock selector of FIG. 4 is that a minimum pulse width is maintained at the time of switching between the two clock signals.

In another embodiment (not shown), the external access signal may be under the direct control of the SPU 40. The CPU 40 may then prevent switching back to the early clock signal between, for example, short bursts of accessing external data handling devices. In a further embodiment, a monostable may be used to hold the external access signal to indicate an external access for a short predetermined period after the end of an external access.

Figure 7:
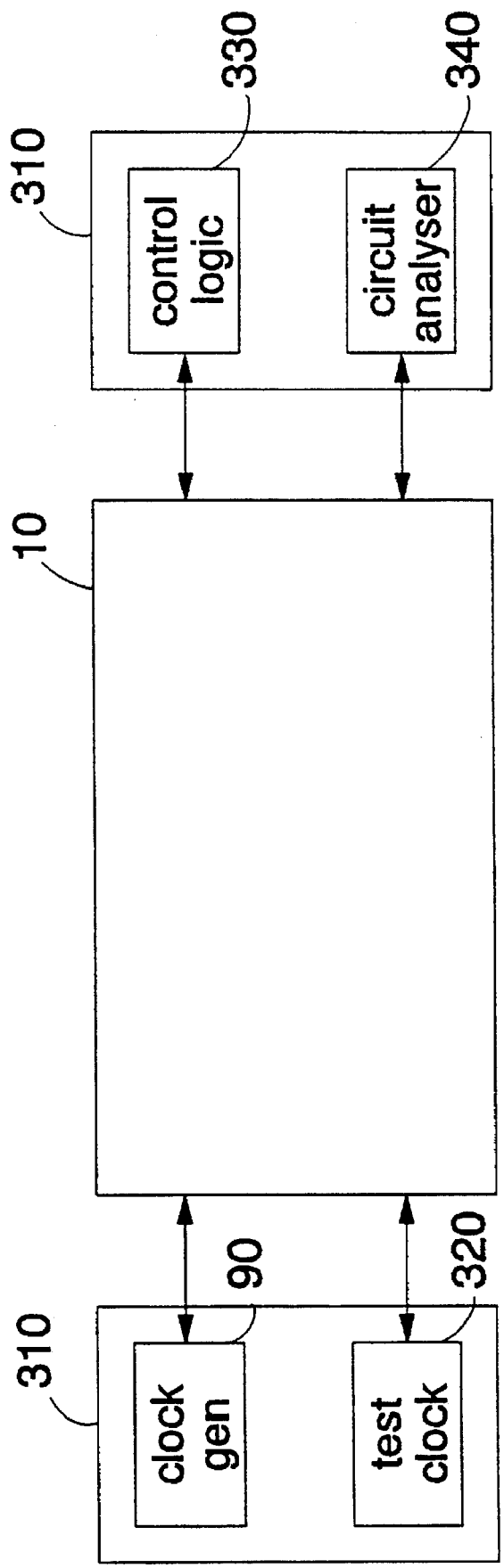
FIG. 7 is a schematic block diagram of a test apparatus.

FIG. 7 is a schematic block diagram of a test apparatus for characterising the inputs and outputs of the integrated circuit 10. Characterisation of data inputs and outputs is a widely used test procedure and involves a determination of the earliest and latest times at which data signals at those inputs and outputs become valid.

In FIG. 7, the test apparatus 310 comprises the clock generator 90 which supplies a clock signal to the buffer 100, a test clock generator 320 which supplies a test clock signal to the pad 190, control logic 330 which is connected to the test disable pad 205 and operates to disable the output buffer 180 of the clock controller 70, and a standard circuit analyser 340. The standard circuit analyser 340 controls the supply of test data signals to the integrated circuit 10 and allows the signal ac timing measurements to be determined for inputs and outputs. Standard setup and hold times may be measured in a standard manner.

By disabling the output buffer 180, the test apparatus of FIG. 7 in conjunction with the clock controller of FIG. 2 allows all data outputs which are driven from the early clock signal to be characterised by the clock signal supplied to the pad 120 by the clock generator 90, and all data inputs which operate relative to the external clock reference to be characterised by externally driving the input buffer 200 with the test clock signal, via the pad 190.

Figure 8:
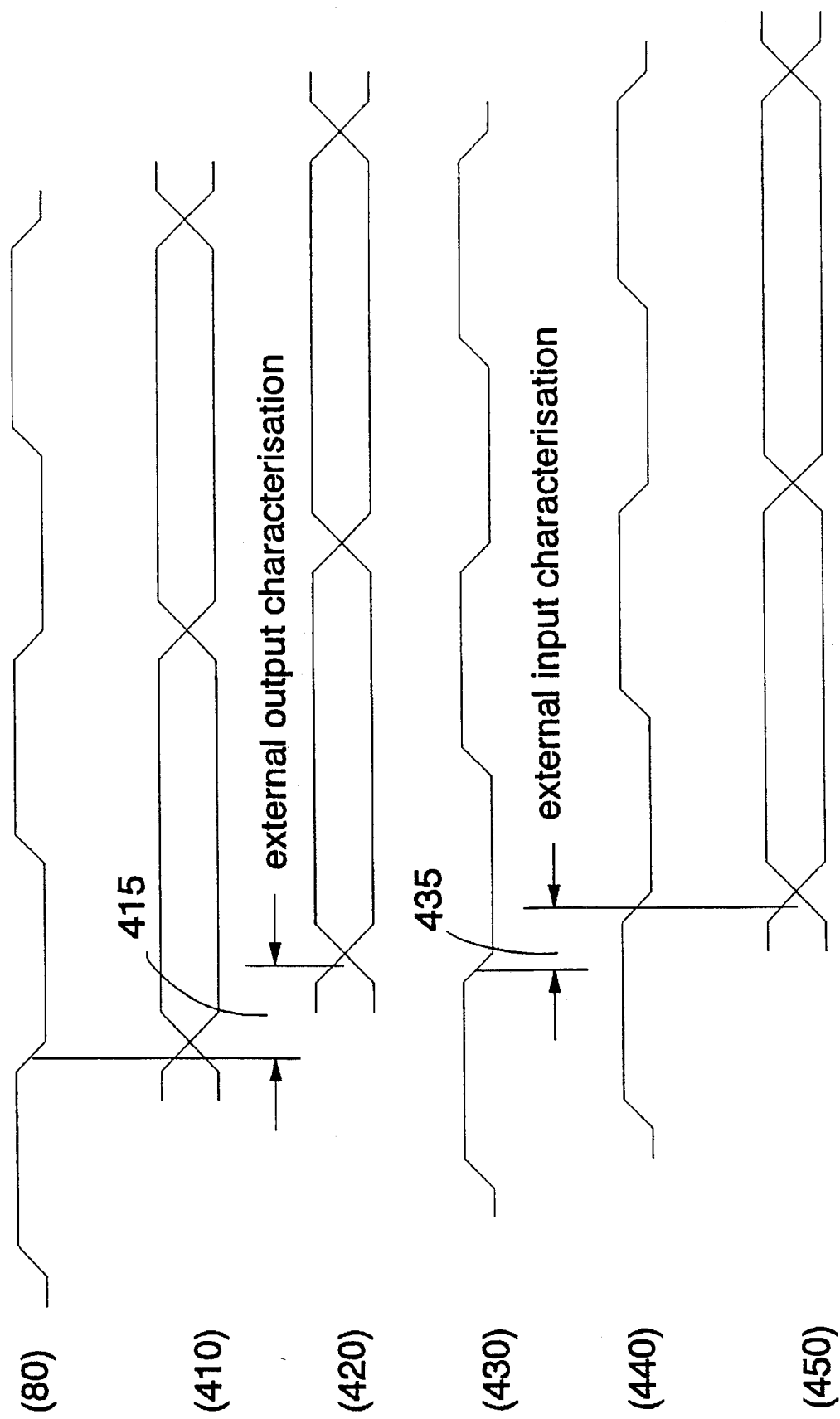
FIG. 8 is a schematic timing diagram illustrating the operation of the clock controller of FIG. 2 when connected to the test apparatus of FIG. 7.

FIG. 8 is a schematic timing diagram illustrating the operation of the clock controller of FIG. 2 when connected to the test apparatus of FIG. 7.

FIG. 8 illustrates the clock signal supplied from the clock generator 90 and buffered by the buffer 100 to form the early clock signal 80. The timing difference between internal signals 410 aligned with the early clock signal 80 and external bus signals 420 supplied as outputs by the data buffer 60 forms the external output characterisation time 415.

The test clock signal 430 generated by the test clock generator 320 is illustrated, along the bus clock generated by the input buffer 200 from the test clock signal 430 and data signals 450 aligned with the bus clock signal 440. The external input characterisation time 435 is detected as the timing difference between the bus aligned signals 450 and the test clock signal 430.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   a plurality of internal data handling devices;
   a data buffer for enabling transfer of data between said internal data handling devices and one or more external data handling devices external to said integrated circuit; and
   a controller, responsive to an original clock signal at a selected clock frequency, for supplying a clock signal to control data transfer between said data handling devices, and said controller comprising a delay circuit operable to delay said original clock signal to generate a delayed clock signal at the selected clock frequency, and a selector operable:
   (i) to inhibit operation of said delay circuit and to select said original clock signal for controlling data transfer from an internal data handling device to another data handling device; and
   (ii) to enable operation of said delay circuit and to select said delayed clock signal for controlling data transfer from an external data handling device to an internal data handling device;
   said selector also being operable to control a time of switching between said original clock signal and said delayed clock signal to establish at lease a predetermined minimum pulse width of clocking pulses supplied to said internal data handling devices.

2. An integrated circuit according to claim 1, in which at least one of said internal data handling devices comprises programmable logic for overriding operation of said selector to enable operation of said delay circuit and to select said delayed clock signal during data transfer from an internal data handling device to another data handling device.

3. An integrated circuit according to claim 1, comprising a clock circuit for generating said original clock signal.

4. An integrated circuit according to claim 1, in which said data buffer comprises:
   an output data buffer operable to transfer data from an internal data handling device to an external data handling device, said output data buffer delaying transferred data by an output delay period; and
   an input data buffer operable to transfer data to an internal data handling device from an external data handling device, said input data buffer delaying transferred data by an input delay period.

5. An integrated circuit according to claim 4, in which said delay circuit comprises:
   a first delay device for delaying said original clock signal by said output delay period to generate an intermediate clock signal; and
   a second delay device connected to receive said intermediate clock signal and operable to delay said intermediate clock signal by said input delay period to generate said delayed clock signal.

6. An integrated circuit according to claim 5, in which said first delay device comprises an output clock buffer connected between said clock generator and an output terminal of said integrated circuit.

7. An integrated circuit according to claim 6, in which said second delay device comprises an input clock buffer connected to said output terminal of said integrated circuit.

8. An integrated circuit according to claim 5, comprising a circuit for supplying said intermediate clock signal to one or more of said external data handling devices.

9. An integrated circuit according to claim 5, comprising logic for temporarily isolating said intermediate clock signal from said second delay device; and in which said second logic device receives a test clock signal when said intermediate clock signal is isolated from said second logic device.

10. An integrated circuit according to claim 1, in which one of said internal data handling devices is a microprocessor.

11. Apparatus for testing an integrated circuit according to claim 9, said apparatus comprising:

means for generating a test clock signal;

means for controlling said logic to temporarily isolate said intermediate clock signal from said second delay device;

means for supplying said test clock signal to said second delay device;

means for initiating test data transfers to and from one or more internal data handling devices; and means for detecting a propagation delay between clock pulses of said test clock signal and data signals output by said integrated circuit.

12. Data processing apparatus comprising:

an integrated circuit according to claim 1, and one or more external data handling devices connected to said integrated circuit.

13. A method of operating an integrated circuit comprising a plurality of internal data handling devices, a data buffer, said data buffer enabling transfer of data between the internal data handling devices and one or more external data handling devices external to said integrated circuit, and control means, responsive to an original clock signal, for supplying a clock signal to control data transfer between said data handling devices, said control means comprising a delay circuit oeprable to delay said original clock signal to generate a delayed clock signal; said method comprising the steps of:

(i) inhibiting operation of said delay circuit and selecting said original clock signal for controlling data transfer from an internal data handling device to another data handling device; and (ii) enabling operating of said delay circuit and selecting said delayed clock signal for controlling data transfer from an external data handling device to an internal data handling device for controlling a time of switching between said original clock signal and said delayed clock signal to establish at least a predetermined minimum pulse width of clocking pulses supplied to said internal data handling devices.

* * * * *